(12) United States Patent  
Xiao et al.

(10) Patent No.: US 9,086,434 B1  
(45) Date of Patent: Jul. 21, 2015

(54) METHODS AND SYSTEMS FOR VOLTAGE REFERENCE POWER DETECTION

(75) Inventors: Ping Xiao, East Palo Alto, CA (US); Weiying Ding, Saratoga, CA (US)

(73) Assignee: ALTERA CORPORATION, San Jose, CA (US)

( * ) Notice: Subject to any disclaimer, the term of this patent is extended or adjusted under 35 U.S.C. 154(b) by 796 days.

(21) Appl. No.: 13/312,571

(22) Filed: Dec. 6, 2011

(51) Int. Cl.
*G01R 19/00* (2006.01)

(52) U.S. Cl.
CPC .................. *G01R 19/0092* (2013.01)

(58) Field of Classification Search
CPC ................ G01R 21/06; G01R 22/10
USPC .......... 324/76.11, 323, 713, 764.01; 713/340, 713/300; 323/283, 284
See application file for complete search history.

(56) References Cited

U.S. PATENT DOCUMENTS

| | | | | |
|---|---|---|---|---|
| 3,965,388 | A * | 6/1976 | Brisk | 315/155 |
| 5,614,857 | A * | 3/1997 | Lim et al. | 327/205 |
| 5,747,978 | A * | 5/1998 | Gariboldi et al. | 323/313 |
| 6,084,383 | A * | 7/2000 | Borinsky et al. | 323/268 |
| 6,304,088 | B1 * | 10/2001 | Yee | 324/433 |
| 7,196,542 | B1 * | 3/2007 | Lee et al. | 326/38 |
| 7,403,051 | B1 * | 7/2008 | Lesea | 327/143 |
| 7,609,049 | B1 * | 10/2009 | Tian et al. | 324/76.11 |
| 7,711,971 | B1 * | 5/2010 | Jurgilewicz | 713/340 |
| 7,876,079 | B2 * | 1/2011 | Nirschl | 323/283 |
| 8,531,194 | B2 * | 9/2013 | Edwards | 324/713 |
| 2002/0158673 | A1 * | 10/2002 | McClure et al. | 327/78 |
| 2010/0176839 | A1 * | 7/2010 | Sugiura et al. | 324/771 |
| 2011/0001555 | A1 * | 1/2011 | Luzzi et al. | 327/539 |

* cited by examiner

*Primary Examiner* — Huy Q Phan  
*Assistant Examiner* — Giovanni Astacio-Oquendo  
(74) *Attorney, Agent, or Firm* — Ropes & Gray LLP

(57) ABSTRACT

Methods and systems for detection and monitoring of power supply voltage and voltage reference circuitry are provided. In one embodiment of the invention, a first signal is set to be proportional to a power supply voltage in response to a determination from control circuitry that an output voltage of bandgap voltage reference circuitry is less than a first threshold voltage. The first signal is set to a logic low level in response to a determination from control circuitry that the output voltage of the bandgap voltage reference circuit is greater than the first threshold voltage, wherein the first threshold voltage is less than a bandgap reference voltage. A value of a reset signal is determined based at least in part on the first signal.

24 Claims, 8 Drawing Sheets

METHODS AND SYSTEMS FOR VOLTAGE REFERENCE POWER DETECTION

BACKGROUND OF THE INVENTION

The present invention relates to power detection systems and methods, and more specifically to detection and monitoring of power supply voltage and voltage reference circuitry.

The function of voltage reference circuitry in an electronic circuit device or system is to provide a constant reference voltage for other part of the circuit in the system. The constant reference voltage may be used by a Power On Reset (POR) circuit in order to keep the system in a reset state during system power-up, thus preventing an unknown initial state in the system.

Conventional POR circuitry usually consists of a simple resistor-capacitor (RC) delay circuitry that generates a reset signal for a predetermined amount of time during system power up, thereby keeping system in reset state for the predetermined period of time. However, use of such RC delay POR circuitry requires the assumption that the power supply voltage will have reached its stable-state value after the predetermined amount of time has passed. Additionally, RC delay POR circuitry is not reliable because it does not directly detect the power supply voltage level. Furthermore, the delay provided by the RC delay POR circuitry has large variability over variations in process, temperature, and power supply voltage (PVT), and accordingly provides a smaller operating margin, especially for low power systems. Moreover, RC delay POR circuitry lacks power supply dip or brownout detection, which is important for robust system operation.

Field programmable gate array (FPGA) devices have in the past employed POR circuitry that compares the voltage levels provided by all of power supplies against a bandgap reference voltage level output by an on-chip bandgap reference circuitry. Because bandgap reference circuitry provides an accurate and stable bandgap reference voltage level during steady-state operation, the POR circuitry may compare voltage levels of the power supplies to accurate and stable thresholds, thereby generating reliable and accurate system reset signal(s). However such comparison POR schemes only work for the detection of other power supplies, and not for the power supply of the bandgap reference circuit itself because during the power-up or brown-out of this power supply, the bandgap circuit is not stable and the comparison POR circuitry may not be referencing a correct reference level.

SUMMARY OF THE INVENTION

To address the above and other shortcomings within the art, the present invention provides systems and methods for determining the value of a reset signal based at least in part on a provided power supply voltage.

In one embodiment of the invention, a system for determining a value of a reset signal is provided. The system includes control circuitry configured to set a first signal to be proportional to a power supply voltage in response to a determination from control circuitry that an output voltage of bandgap voltage reference circuitry is less than a first threshold voltage. The control circuitry is further configured to set the first signal to a logic low level in response to a determination from the control circuitry that the output voltage of the bandgap voltage reference circuit is greater than the first threshold voltage, wherein the first threshold voltage is less than a bandgap reference voltage. The control circuitry is further configured to determine a value of a reset signal based at least in part on the first signal.

In some embodiments of the present invention, the control circuitry is further configured to set a second signal to be proportional to the power supply voltage for any value of the power supply voltage that is less than a second threshold. The control circuitry is further configured to set the second signal to a logic low level in response to the power supply voltage being greater than the second threshold, wherein the second threshold is at least partially determined by a threshold voltage of a PMOS transistor and a threshold voltage of an NMOS transistor. The control circuitry is further configured to determine the value of the reset signal based at least in part on the second signal.

In some embodiments of the present invention, the control circuitry is further configured to set a third signal to be proportional to the power supply voltage in response to a scaled output of the bandgap voltage reference circuit being less than a threshold voltage of a transistor. The control circuitry is further configured to set the third signal to a logic low level in response to the scaled output of the bandgap voltage reference circuit being less than a threshold voltage of the transistor. The control circuitry is further configured to determine the value of the reset signal based at least in part on the third signal.

In some embodiments of the present invention, the control circuitry is further configured to set a fourth signal to be proportional to the power supply voltage in response to the scaled value of the power supply voltage being less than the output voltage of the bandgap voltage reference circuit. The control circuitry is further configured to set the fourth signal to a logic low level in response to the scaled value of the power supply voltage being greater than the output voltage of the bandgap voltage reference circuit. The control circuitry is further configured to determine the value of the reset signal based at least in part on the fourth signal.

In some embodiments of the present invention, the value of the reset signal is determined as a logical OR function of the first signal, the second signal, the third signal, and the fourth signal.

In another embodiment of the present invention, a method for determining a value of a reset signal is provided. The method includes setting a first signal to be proportional to a power supply voltage in response to a determination from control circuitry that an output voltage of bandgap voltage reference circuitry is less than a first threshold voltage. The method further includes setting the first signal to a logic low level in response to a determination from the control circuitry that the output voltage of the bandgap voltage reference circuit is greater than the first threshold voltage, wherein the first threshold voltage is less than a bandgap reference voltage. The method further includes determining a value of a reset signal based at least in part on the first signal.

In some embodiments of the present invention, the method further includes setting a second signal to be proportional to the power supply voltage for any value of the power supply voltage that is less than a second threshold. The method further includes setting the second signal to a logic low level in response to the power supply voltage being greater than the second threshold, wherein the second threshold is at least partially determined by a threshold voltage of a PMOS transistor and a threshold voltage of an NMOS transistor. The method further includes determining the value of the reset signal based at least in part on the second signal.

In some embodiments of the present invention, the method further includes setting a third signal to be proportional to the power supply voltage in response to a scaled output of the bandgap voltage reference circuit being less than a threshold voltage of a transistor. The method further includes setting the third signal to a logic low level in response to the scaled output of the bandgap voltage reference circuit being less than a threshold voltage of the transistor. The method further includes determining the value of the reset signal based at least in part on the third signal.

In some embodiments of the present invention, the method further includes setting a fourth signal to be proportional to the power supply voltage in response to the scaled value of the power supply voltage being less than the output voltage of the bandgap voltage reference circuit. The method further includes setting the fourth signal to a logic low level in response to the scaled value of the power supply voltage being greater than the output voltage of the bandgap voltage reference circuit. The method further includes determining the value of the reset signal based at least in part on the fourth signal.

In some embodiments of the present invention, the method further includes determining the value of the reset signal as a logical OR function of the first signal, the second signal, the third signal, and the fourth signal.

Advantageously, POR systems, methods, and variations thereof within the scope of the present invention, may be self-referencing, i.e., may reliably and accurately detect a power supply voltage using control circuitry powered by the same power supply voltage.

A further advantage of the present invention is that POR systems, methods, and variations thereof within the scope of the present invention, may provide a reliable reset signal for all values of the power supply voltage ranging from ground voltage level to a trip voltage level at which the system has reached its normal operating state. Furthermore, the provided trip voltage level may be accurate and stable under variations in PVT.

A still further advantage of the present invention is that POR systems, methods, and variations thereof within the scope of the present invention, are compatible with functionality of other POR circuitries that may be monitoring power supplies in a given system, allowing for easy characterization during design and easy integration into the system.

A still further advantage of the present invention is that POR systems, methods, and variations thereof within the scope of the present invention, may be easily adapted and reconfigured for use in a variety of systems.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the invention, certain illustrative embodiments will now be described. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

As mentioned previously, the function of voltage reference circuitry in an electronic circuit device or system is to provide a constant reference voltage for other part of the circuit in the system. For example, an FPGA or another system may include an on-chip bandgap voltage reference circuit to generate a bandgap reference voltage. The bandgap reference voltage may be used by a POR circuit in order to keep the system in a reset state during system power-up, thus preventing an unknown initial state in the system.

During system power-up, the bandgap voltage reference circuitry transitions through a power-up phase before its output reaches its stable state. Because the bandgap voltage reference circuitry is powered by a power supply voltage, the output of the bandgap voltage reference circuitry enters its stable state when the power supply voltage is about equal to or greater than a threshold level.

Before the power supply ramps up to this threshold level, the output of bandgap voltage reference circuitry may be unstable and/or deviate from an expected bandgap reference voltage level. As a result, the circuitries referencing the bandgap voltage reference circuitry may work improperly because the referencing circuitries would be comparing their respective voltages against a voltage level different from the expected bandgap reference voltage level. In order to ensure the referencing circuitries operate correctly and/or predictably, various embodiments of the present invention provide circuitries to detect the power supply voltage (which powers the bandgap voltage reference circuitry) during system power-up, and/or monitor the operation of the bandgap voltage reference circuitry in order to generate a signal to indicate when the bandgap voltage reference circuitry output is stable and ready to be referenced.

Figure 1:
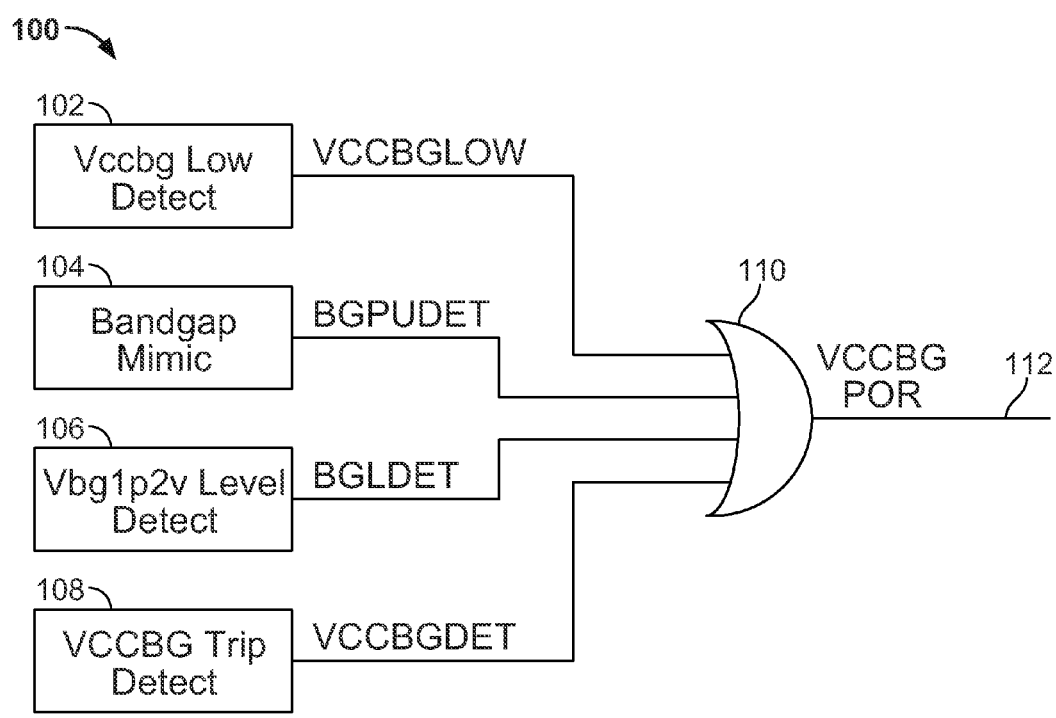
FIG. 1 shows an exemplary system for determining a value of a reset signal according to an embodiment of the present invention.

FIG. 1 shows a system 100 for determining a value of a reset signal 112 according to an embodiment of the present invention. System 100 may include low voltage detection circuitry 102, bandgap mimic circuitry 104, bandgap level detection circuitry 106, and trip detection circuitry 108. In some embodiments, system 100 may omit one or more of the circuitries 102, 104, 106 and 108. For example, system 100 may include circuitries 102, 104 and 108 without including bandgap level detection circuitry 106. In another example, system 100 may include only bandgap mimic circuitry 104.

Circuitry 102 provides a first output signal (i.e., VCCBGLOW). Circuitry 104 provides a second output signal (i.e., BGPUDET). Circuitry 106 provides a third output signal (i.e., BGLDET). Circuitry 108 provides a fourth output signal (i.e., VCCBGDET). The value of the reset signal 112 (i.e., VCCBG POR) may determined by circuitry 110 based at least in part on one or more of the first, second, third and fourth output signals, which may be input into the circuitry 110 as shown in FIG. 1. In some embodiments, the value of the output signal 112 may be determined as a logical OR function of one or more of the first, second, third and fourth output signals. For example, if the output signal 112 is a logical OR function of the first, second, third, and fourth output signals, then the reset signal is set to a logic high level (i.e., a logical '1') if at least one of the first, second, third and fourth signals is in a logic high level.

In some embodiments, system 100 provides the reset signal 112 for a larger system. In some embodiments, the larger system is kept in a reset state as long as the reset signal 112 is set to a logic high level. Advantageously, the larger system is thus prevented from being erroneously initialized during system power-up, when the power supply voltage and/or the output of bandgap voltage reference circuitry has not reached levels sufficient for proper system operation.

In some embodiments, one or more of the elements 102, 104, 106, 108 and 110 of system 100 are powered by the power supply voltage.

In some embodiments, the reset signal 112 output by system 100 is coupled to a high-resistance pull-up resistance (not shown), which is connected to the power supply voltage. Advantageously, in these embodiments, system 100 provides an output with a value proportional to the value of the power supply voltage even when the value of the power supply voltage may be too low for circuitry 110 to provide a reliable output.

Figure 2A:
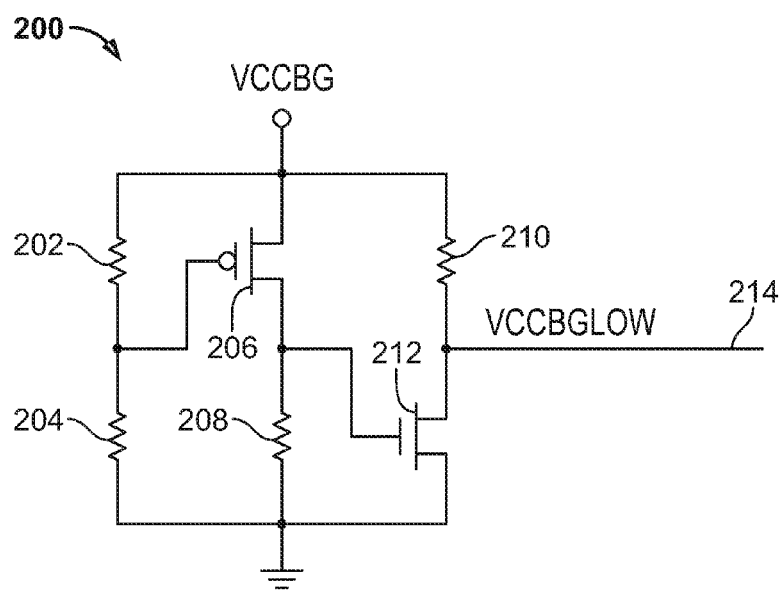
FIG. 2A shows exemplary low power supply voltage detection circuitry according to an embodiment of the present invention.

FIG. 2A shows low level detection circuitry 200 according to an embodiment of the present invention. In some embodiments, low level detection circuitry 102 shown in FIG. 1 may be implemented as the low level detection circuitry 200. Low level detection circuitry 200 provides an output signal 214 (i.e., VCCBGLOW).

Circuitry 200 includes resistances 202 and 204. Resistance 202 is connected to the power supply voltage VCCBG at one end, and is connected to resistance 204 and a gate terminal of transistor 206 at the other end. Resistance 204 is connected to the resistance 202 and the gate terminal of transistor 206 at one end, and to the ground voltage at the other end. Together, resistances 202 and 204 form a voltage divider with an output connected to the gate terminal of the p-channel metal oxide semiconductor field effect transistor (PMOS transistor) 206. As used herein, a voltage divider is a structure, connected to a source voltage (e.g., the power supply voltage VCCBG), which provides as its output a voltage which is a fraction of the source voltage (i.e., a fraction multiplied by the source voltage, or a scaled value of the source voltage). The fraction is determined by the relationship between various components of the voltage divider. The voltage divider formed by the resistances 202 and 204 provides the gate terminal of the transistor 206 with a fraction (i.e., a scaled value) of the power supply voltage VCCBG, wherein the fraction is determined by the relationship between the values of the resistances 202 and 204.

Circuitry 200 further includes the PMOS transistor 206 and a resistance 208. The transistor 206 has its source terminal connected to VCCBG and its drain terminal connected to the resistance 208 and a gate terminal of an n-channel metal oxide semiconductor field effect transistor (NMOS transistor) 212. Resistance 208 is connected to the drain terminal of the transistor 206 and the gate terminal of the transistor 212 at one end, and to the ground voltage at the other end. Together, the resistance 208 and the transistor 206 form a voltage divider which provides the gate terminal of the transistor 212 with a fraction (i.e., a scaled value) of the power supply voltage VCCBG, wherein the fraction is determined by the relationship between the value of the impedance provided by the transistor 206 and the value of the resistance 208.

Circuitry 200 further includes a resistance 210 and the NMOS transistor 212. The resistance 210 is connected to VCCBG at one end, and is connected to the output signal 214 (i.e., VCCBGLOW) and a drain terminal of transistor 212 at the other end. The transistor 212 has its drain terminal connected to the resistance 210 and the output signal VCCBGLOW 214, and its source terminal connected to the ground voltage. Together, the resistance 210 and the transistor 212 form a voltage divider which provides the output signal 214 with a fraction (i.e., a scaled value) of the power supply voltage VCCBG, wherein the fraction is determined by the relationship between the value of the resistance 210 and an impedance provided by the transistor 212.

Figure 2B:
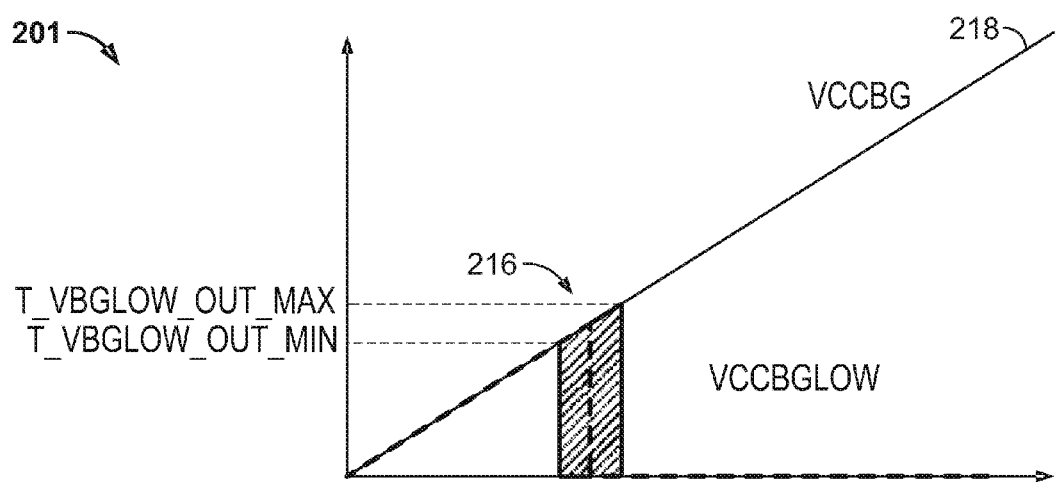
FIG. 2B shows an exemplary output of the low power supply voltage detection circuitry according to an embodiment of the present invention.

FIG. 2B shows exemplary output 201 of low power supply voltage detection circuitry according to an embodiment of the present invention. In particular, FIG. 2B shows the value of the VCCBGLOW signal 214 output by the circuitry 200 shown in FIG. 2A as a function of the power supply voltage VCCBG supplied to the circuitry 200.

During system power-up, the power supply voltage VCCBG starts at a ground voltage level, increases, and finally settles into its stable-state value. For all values of the power supply voltage VCCBG less than a first threshold value, the difference between the voltage at the gate terminal of the transistor 206 and the voltage at the source terminal of the transistor 206 (i.e., the gate-to-source voltage of the transistor 206) is less than a threshold gate-to-source voltage of the transistor 206. Accordingly, the transistor 206 is in a nonconductive state. It should be noted that the gate-to-source voltage of the transistor 206 is determined by the difference between the power supply voltage (i.e., the source voltage of the transistor 206) and the fraction of the power supply voltage supplied to the gate terminal of the transistor 206 by the voltage divider formed by the resistances 202 and 204.

When the transistor 206 is in a nonconductive state, the voltage at the gate terminal of the transistor 212 is pulled down to the ground voltage level by the resistance 208. Accordingly, the gate-to-source voltage of the transistor 212 is less than a threshold gate-to-source voltage of the transistor 212, and the transistor 212 is in a nonconductive state. It should be noted that the gate-to-source voltage of the transistor 212 is determined by the difference between the ground voltage and the fraction of the power supply voltage supplied to the transistor 212 by the voltage divider formed by the transistor 206 and resistance 208. When transistor 212 is in a nonconductive state, the output signal 214 is pulled up to a value proportional to the power supply voltage VCCBG by the resistance 210.

When the value of the power supply voltage VCCBG is about equal to or greater than the threshold value, the gate-to-source voltage of transistor 206 about equals or exceeds the threshold gate-to-source voltage of the transistor 206, and the transistor 206 is placed in a conductive state. When the transistor 206 is in a conductive state and the value of the power supply voltage is about equal to or greater than a second threshold value (which may be higher or lower than the first threshold value), the gate-to-source voltage of the transistor 212 about equals or exceeds the threshold gate-to-source voltage of the transistor 212, and the transistor 212 is placed in a conductive state. When the transistor 212 is in a conductive state, it pulls the value of the output signal 214 to the ground voltage, which is used encode a logic low level. Thus, for all values of the power supply voltage VCCBG 218 greater than a threshold voltage 216, the output signal 214 is at a logic low level. Furthermore, as shown above, the output signal 214 is proportional to the power supply voltage VCCBG for any value of the power supply voltage that is less than the threshold 216.

In some embodiments, the value of the threshold voltage 216 may be adjusted by a user of system 200 by adjusting the values of resistances 202, 204, 208 and 210, as well the characteristics of the transistors 206 and 212. It should be noted that the value of the threshold voltage 216 may vary between T_VBGLOW_OUT_MIN and T_VBGLOW_OUT_MAX due to temperature, the characteristics of the components included in circuitry 200, and other factors. Advantageously, circuitry 200 outputs a reliable output signal 212, which is either proportional to the power supply voltage or corresponds to a logic low level, for all values of the power supply voltage.

Advantageously, system 200 may be used to indicate that the power supply voltage has reached a value that allows proper operation of transistors that may be representative of transistors used in the larger system.

It will be appreciated by those skilled in the art that although a particular implementation of circuitry 200 is shown, other configurations may be implemented without departing from the scope and spirit of the invention. For example, components (such as, for example, resistances 202 and 210) may be removed, and components such as additional resistances and transistors may be added, as long as the modified circuitry 200 outputs a signal substantially similar to VCCBGLOW as shown in FIG. 2B across all values of the power supply voltage.

Figure 3A:
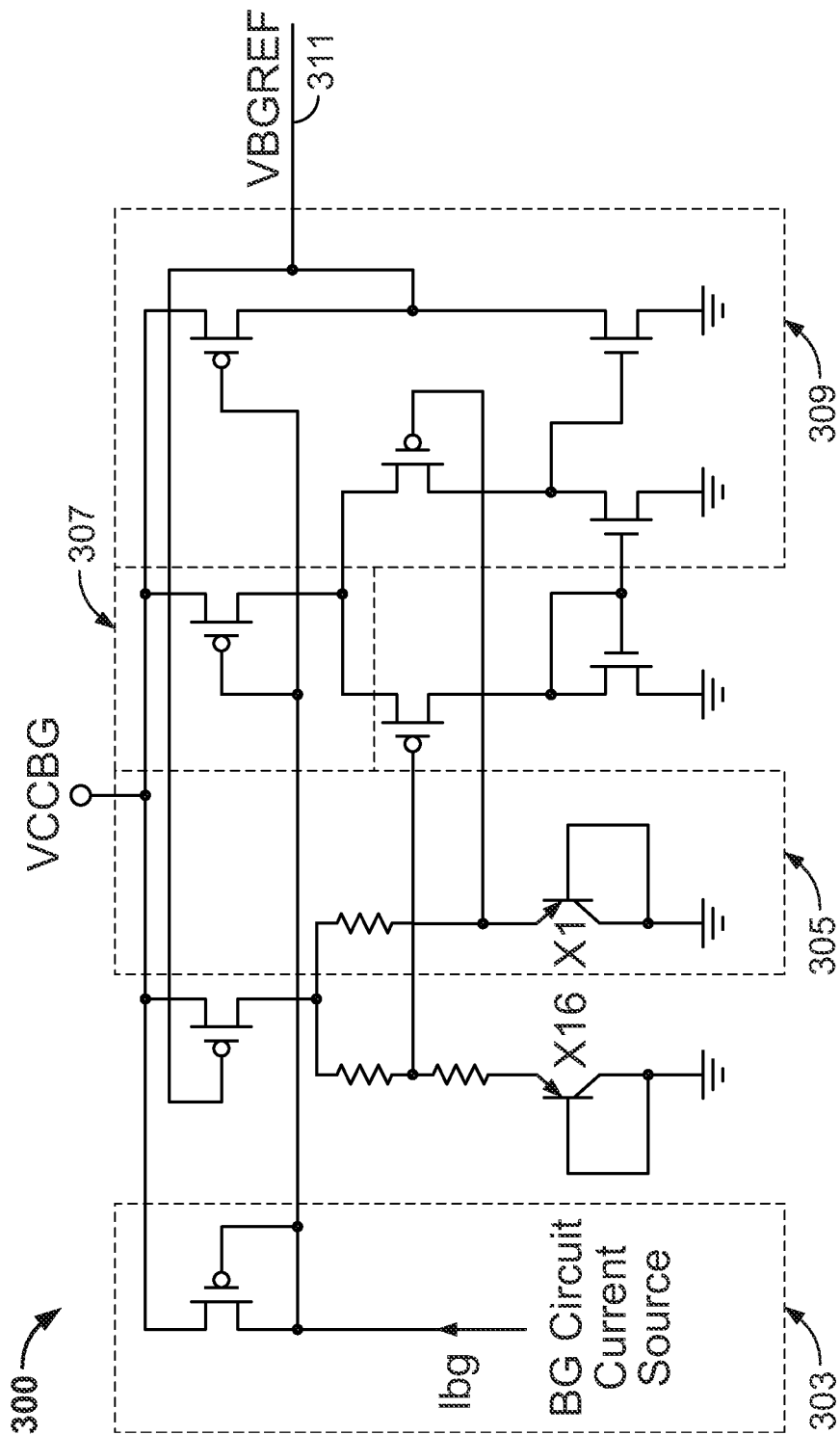
FIG. 3A shows exemplary bandgap voltage reference circuitry according to an embodiment of the present invention.

FIG. 3A shows exemplary bandgap voltage reference circuitry 300 according to an embodiment of the present invention. The inputs to the circuitry 300 include the power supply voltage VCCBG and a bias current IBG from a current source (not shown). Circuitry 300 outputs a voltage VBGREF 311.

After system startup, when the power supply voltage VCCBG and bias current IBG have reached levels necessary for proper operation of the circuitry 300, circuitry 300 reaches a stable state, wherein its output voltage VBGREF 311 reaches a stable level that is substantially equal to the expected bandgap reference voltage level. The value of the expected bandgap reference voltage level is determined in part by intrinsic physical characteristics of the circuitry, e.g., the band gap of silicon, which is used to manufacture elements of circuitry 300. In some embodiments, the value of the expected bandgap reference voltage is approximately equal to 1.2 Volts. Once circuitry 300 has reached a stable state, its design allows it to output the voltage level VBGREF 311 that stable to variations in process (i.e., the deviations of characteristics of component elements of circuitry 300 from their ideal design parameters), power supply voltage, and temperature (i.e., PVT). Accordingly, in stable state, circuitry 300 outputs a voltage VBGREF 311 that has a precise, known value which is stable under variations in PVT.

Figure 3B:
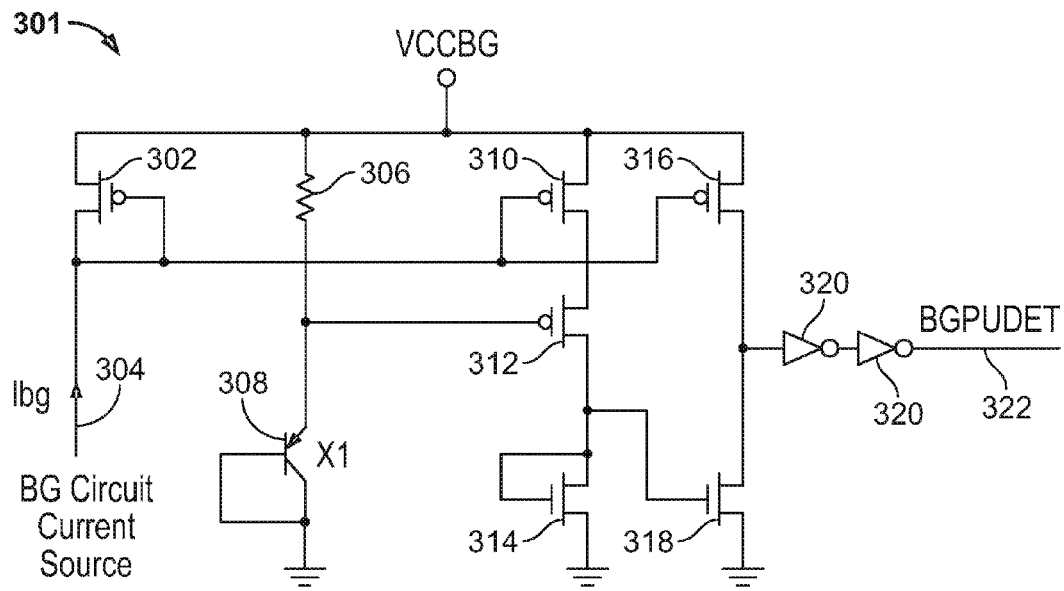
FIG. 3B shows exemplary bandgap mimic circuitry according to an embodiment of the present invention.

FIG. 3B shows exemplary bandgap mimic circuitry 301 according to an embodiment of the present invention. The power supply voltage VCCBG and the bias current IBG from the current source, which are provided as inputs to circuitry 300, are also provided as inputs to circuitry 301. Bandgap mimic circuitry 301 provides an output signal BGPUDET 322.

Bandgap mimic circuitry 301 is designed to approximate the behavior of various components of the bandgap voltage reference circuitry 300 during system power-up. Accordingly, circuitry 301 includes the components of circuitry 300 enclosed within the regions 303, 305, 307 and 309. However, the characteristics of the various components of circuitry 301 (e.g., value of resistance 306) may be different from the characteristics of the corresponding components of circuitry 300.

Circuitry 301 is provided with the bias current IBG 304, which is input into gate terminals of PMOS transistors 302, 310, and 316 and into a drain terminal of the transistor 302. In some embodiments, the bias current IBG 304 is the same bias current IBG that is provided to the bandgap voltage reference circuitry 300. In some embodiments, the bias current IBG 304 is selected such that the transistors are properly biased when circuitry 301 is in stable-state. In some embodiments, the bias current IBG is selected such that the transistors 302, 310 and 316 are in their respective saturation operating regions when VCCBG and IBG 304 have reached their stable-state values.

Circuitry 301 includes resistance 306 and a PNP-type bipolar junction transistor 308. Resistance 306 is connected to VCCBG at one end, and is connected to a gate terminal of PMOS transistor 312 and an emitter terminal of the transistor 308 at the other end. The emitter terminal of the transistor 308 is connected to the resistance 306 and the gate terminal of the transistor 312. Base and collector terminals of the transistor 308 are connected to the ground voltage level. Accordingly, the transistor 308 is in a diode configuration. Together, the resistance 306 and the transistor 308 form a voltage divider which provides the gate terminal of the transistor 312 with a fraction of the power supply voltage VCCBG, wherein the fraction is determined by the relationship between the value of the resistance 306 and an impedance provided by the transistor 308.

Circuitry 301 further includes the PMOS transistor 310, the PMOS transistor 312, and NMOS transistor 314. The transistor 310 has a source terminal that is connected to VCCBG, a drain terminal that is connected to a source terminal of transistor 312, and the gate terminal that is connected to the current source IBG. Transistor 312 has the source terminal that is connected to the drain terminal of transistor 310, the gate terminal that is connected to the output of the voltage divider formed by the resistance 306 and the transistor 308, and a drain terminal that is connected to source and gate terminals of the transistor 314, and to a gate terminal of NMOS transistor 318. Transistor 314 has its gate and drain terminals connected to the drain terminal of the transistor 312 and the gate terminal of the transistor 318, and its source terminal connected to the ground voltage. Accordingly, the transistor 314 is in a diode configuration. Together, the transistors 310, 312 and 314 form a voltage divider which provides the gate terminal of the transistor 318 with a fraction of the power supply voltage VCCBG, wherein the fraction is determined by the relationship between the impedances provided by the transistors 310, 312 and 314.

Circuitry 301 further includes the PMOS transistor 316 and the NMOS transistor 318. The transistor 316 has its source terminal connected to VCCBG, its gate terminal connected to the current source IBG, and its drain terminal connected to an input of buffer circuitry 320 and a source terminal of the transistor 318. The transistor 318 has its drain terminal connected to the drain terminal of the transistor 316 and the input of the buffer circuitry 320, its gate terminal connected to the output of the voltage divider formed by the transistors 312 and 314, and its source terminal connected to the ground voltage. Together, the transistors 316 and 318 form a voltage divider which provides the input of the buffer circuitry 320 with a fraction of the power supply voltage VCCBG, wherein the fraction is determined by the relationship between the value of the impedances provided by the transistors 316 and 318. The buffer circuitry 320 buffers the signal provided by the voltage divider formed by the transistors 316 and 318, and provides it as an output signal BGPUDET 322.

Figure 3C:
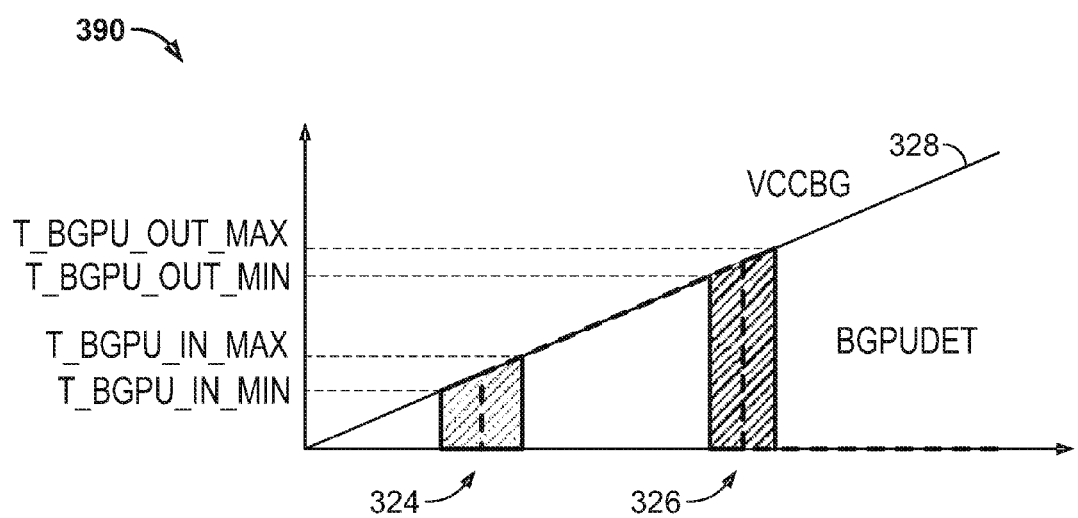
FIG. 3C shows an exemplary output of the bandgap mimic circuitry according to an embodiment of the present invention.

FIG. 3C shows exemplary output 390 of bandgap mimic circuitry according to an embodiment of the present invention. In particular, FIG. 3C shows the value of the BGPUDET signal 322 output by the circuitry 301 shown in FIG. 3B as a function of the power supply voltage VCCBG.

During system power-up, the power supply voltage VCCBG and the bias current IBG begin at zero, increase, and settle at their respective stable-state values. When the bias current is about equal to or greater than a threshold value and a power supply voltage VCCBG 328 is about equal to or greater than the threshold voltage 324, the gate-to-source voltage of the transistor 316 about equals or exceeds the threshold gate-to-source voltage of the transistor 316, and the transistor 316 is placed in a conductive state. However, because of the design of bandgap mimic circuitry 301, the transistor 318 is not placed in a conductive state until the power supply voltage is about equal to or greater than a threshold voltage 326. Accordingly, the input to the buffer circuitry 320 (and consequently the value of the output signal BGPUDET 322) is pulled up by the transistor 316 such that it is proportional to the power supply voltage VCCBG 328. Thus, for all values of the power supply voltage VCCBG 328 between the threshold voltage 324 and the threshold voltage 326 (and assuming an appropriate relationship between VCCBG 328 and IBG 304 is maintained), the value of the output signal BGPUDET 322 is proportional to the value of the power supply voltage VCCBG 328. It should be noted that the output signal BGPUDET 322 may be close to the ground voltage or be in an unknown state when the bias current is less than the threshold value and the power supply voltage is less than the threshold voltage 324.

For some value of the power supply voltage VCCBG that is greater than the threshold voltage 324 but is less than the threshold voltage 326, the transistors 302, 310 and 316 are in conductive states. Additionally, the scaled value of VCCBG input into the diode-configured transistor 308 is sufficient to place the transistor 308 in a conductive state. Additionally, a gate-to-source voltage of the transistor 312 is sufficient to place the transistor 312 in a conductive state. Additionally, the scaled value of VCCBG input into the diode-configured transistor 314 is sufficient to place the transistor 314 in a conductive state. However, gate-to-source voltage of the transistor 318 is not yet large enough to place the transistor 318 in a conductive state, ensuring that the output signal BGPUDET 322 is proportional to the power supply voltage VCCBG.

When the power supply voltage VCCBG is about equal to or greater than the threshold voltage 326, the gate-to-source voltage of the transistor 318 becomes sufficiently large to place the transistor 318 into a conductive state. When the transistor 318 is in a conductive state, the voltage level input into the buffer circuitry 320 is pulled down close to the ground voltage (used to encode a logic low level) by the transistor 318. Accordingly, for all values of the power supply voltage greater than the threshold voltage 326, the output signal BGPUDET 322 is placed in a logic low level.

The value of the threshold voltages 324 and 326 are determined based at least in part on the values of the resistance 306, as well the characteristics of the transistors 302, 308, 310, 312, 314, 316 and 318. In some embodiments, a user of system 301 may adjust the values of the threshold voltage 324 and/or the threshold voltage 326 by adjusting the values of the resistance 306, as well the characteristics of the transistors 302, 308, 310, 312, 314, 316 and 318. It should be noted that the value of the threshold voltage may vary between T_BGPU_IN_MIN and T_BGPU_IN_MAX due to temperature, the characteristics of the components included in system 301, and other factors. Similarly, the value of the threshold voltage 326 may vary between T_BGPU_OUT_MIN and T_BGPU_OUT_MAX due to temperature, the characteristics of the components included in system 301, and other factors. Advantageously, circuitry 301 may be used to indicate that the circuitry 300 is entering a stable operating state (i.e., steady state). In particular, circuitry 301 has the same inputs as circuitry 300, and circuitry 301 includes components configured in a manner similar to the corresponding components included in circuitry 300. Accordingly, the characteristics of the components included in circuitry 301 can be selected such that a logic low level provided to buffer circuitry 320 (and subsequently output as the output signal BGPUDET 322) is an indication that the circuitry 300 is entering a steady operating state. In some embodiments, the characteristics of the components included in circuitry 301 are selected such that the circuitry 301 begins to output a logic low level before circuitry 300 enters a stable operating state (i.e., the threshold voltage 326 is determined to be less than the value of the power supply voltage at which circuitry 300 enters into a steady operating state).

It will be appreciated by those skilled in the art that although a particular implementation of circuitry 301 shown, other configurations may be implemented without departing from the scope and spirit of the invention. For example, components may be removed, components such as additional resistances, transistors and buffers may be added, and existing components may be connected in different configurations, as long as the modified circuitry 301 outputs a signal substantially similar to BGPUDET as shown in FIG. 3C across all values of the power supply voltage VCCBG. Additionally, circuitry 301 may be modified to mimic the power-up behavior of bandgap voltage reference circuitry different from that shown in FIG. 3A, as long as the modified circuitry 301 outputs a signal substantially similar to BGPUDET as shown in FIG. 3C across all values of the power supply voltage VCCBG.

Figure 4A:
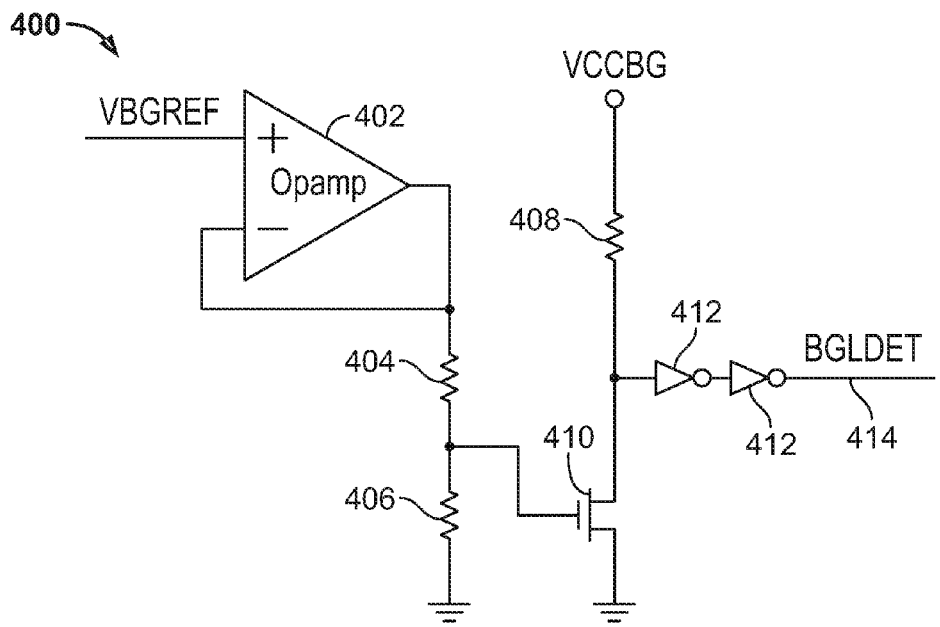
FIG. 4A shows exemplary bandgap level detection circuitry according to an embodiment of the present invention.

FIG. 4A shows exemplary bandgap level detection circuitry 400 according to an embodiment of the present invention. In some embodiments, bandgap level detection circuitry 106 shown in FIG. 1 may be implemented as the bandgap level detection circuitry 400. Bandgap level detection circuitry 400 provides an output signal BGLDET 414.

Circuitry 400 includes a unity gain buffer 402, which buffers a voltage VBGREF output by bandgap voltage reference circuitry (not shown). Circuitry 400 further includes resistances 404 and 406 and NMOS transistor 410. Together, the resistances 404 and 406 form a voltage divider which provides gate terminal of the transistor 410 with a fraction of the voltage VBGREF, wherein the fraction is determined by the relationship between a value of the resistance 404 and a value of the resistance 406.

Circuitry 400 further includes resistance 408. Together, the resistance 408 and the transistor 410 form a voltage divider which provides the buffer circuitry 412 with a fraction of the power supply voltage VCCBG, wherein the fraction is determined by the relationship between the value of the resistance and an impedance provided by the transistor 410. The buffer circuitry 412 buffers the voltage level provided by the voltage divider formed by the resistance 408 and the transistor 410 and provides it as the output signal BGLDET 414.

Figure 4B:
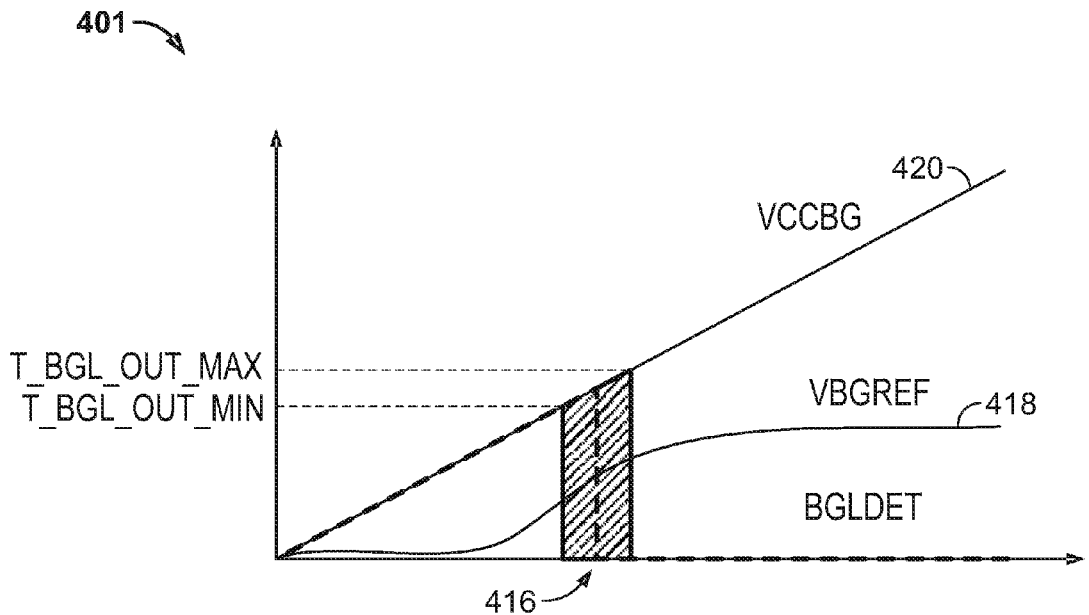
FIG. 4B shows an exemplary output of the bandgap level detection circuitry according to an embodiment of the present invention.

FIG. 4B shows exemplary output 401 of bandgap level detection circuitry according to an embodiment of the present invention. In particular, FIG. 4B shows the value of the BGLDET signal 414 output by the circuitry 400 shown in FIG. 4A as a function of the power supply voltage VCCBG and the voltage VBGREF 418 supplied to the circuitry 400.

During system power-up, the voltage VBGREF starts at a ground voltage level, increases, and settles into its stable-state value. For all values of the voltage VBGREF 418 that are less than a threshold voltage 416, the gate-to-source voltage of the transistor 410 is less than the threshold gate-to-source voltage of the transistor 410, and the transistor 410 is in a nonconductive state. It should be noted that the gate-to-source voltage of the transistor 410 is determined by the difference between the ground voltage (i.e., the voltage input into the source terminal of the transistor 410) and the fraction of the voltage VBGREF 418 provided to the gate terminal of the transistor 410 by the voltage divider formed by resistances 404 and 406.

When the transistor 410 is in a nonconductive state, the voltage level input into the buffer circuitry 412 is pulled up to the power supply voltage VCCBG by the resistor 408. Accordingly, for all values of the voltage VBGREF 418 less than the threshold voltage 416, the value of the output signal BGLDET 414 is proportional to the power supply voltage VCCBG 420.

When the value of the voltage VBGREF 418 is about equal to or greater than the threshold voltage 416, the gate-to-source voltage of transistor 410 about equals or exceeds the threshold gate-to-source voltage of the transistor 410, and the transistor 410 is placed in a conductive state. When the transistor 410 is in a conductive state, the voltage level input into the buffer circuitry 412 is pulled down close to the ground voltage (used to encode a logic low level) by the transistor 410. Accordingly, for all values of the voltage VBGREF 418 greater than the threshold voltage 416, the output signal BGLDET 414 is set to a logic low level.

In some embodiments, the value of the threshold voltage 416 may be adjusted by a user of system 400 by adjusting the values of the resistances 404 and 406, as well the characteristics of the buffer 402 and the transistor 410. It should be noted that the value of the threshold voltage 416 may vary between T_BGL_OUT_MIN and T_BGL_OUT_MAX due to temperature, the characteristics of the components included in system 400, and other factors. Advantageously, system 400 may be used to indicate whether the bandgap voltage reference circuitry is functioning properly. For example, through appropriate choice of resistances 404 and 406 (and consequently, of the value of the voltage VBGREF necessary to place the transistor 410 in a conductive state), system 400 may be used to indicate whether the voltage VBGREF provided by the bandgap voltage reference circuitry is within a certain range of the predetermined expected bandgap reference voltage level (e.g., 1.2 Volts).

It will be appreciated by those skilled in the art that although a particular implementation of circuitry 400 is shown, other configurations may be implemented without departing from the scope and spirit of the invention. For example, components (such as, for example, resistance 404) may be removed, components such as additional resistances, transistors and buffers may be added, and existing components may be connected in different configurations, as long as the modified circuitry 400 outputs a signal substantially similar to BGLDET as shown in FIG. 4B across all values of the voltage VBGREF 418.

Figure 5A:
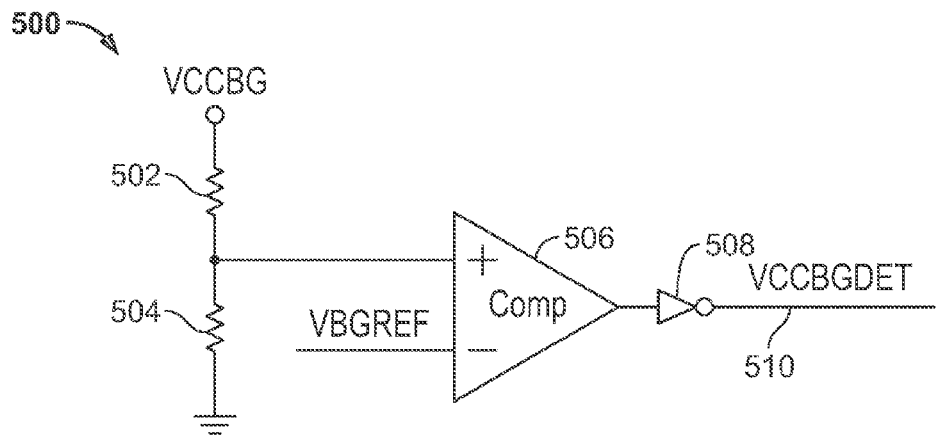
FIG. 5A shows exemplary trip detection circuitry according to an embodiment of the present invention.

FIG. 5A shows exemplary trip detection circuitry 500 according to an embodiment of the present invention. In some embodiments, trip detection circuitry 108 shown in FIG. 1 may be implemented as trip detection circuitry 500. Trip detection circuitry 500 provides an output signal VCCBGLDET 510.

Circuitry 500 includes resistances 502 and 504 and a comparator 506. Together, the resistances 502 and 504 form a voltage divider which provides the positive input terminal of the comparator 506 with a scaled value of the power supply voltage VCCBG, wherein scaled value is determined by the relationship between a value of the resistance 502 and a value of the resistance 504.

Comparator 506 compares the scaled value of the power supply voltage VCCBG with the voltage VBGREF provided by the bandgap voltage reference circuitry (not shown), and outputs a logic high level if the scaled value of VCCBG is the greater of the two, and a logic low value if the voltage VBGREF is the greater of the two. It should be noted that because the power supply voltage level VCCBG is used to power the comparator 506, the output of the comparator 506 is proportional to VCCBG (used to encode a logic high level) when VCCBG is sufficiently large for proper operation of the comparator 506.

The output of the comparator 506 is inverted using inverter circuitry 508, which outputs the output signal VCCBGDET 510. In some embodiments, the inverter circuitry 508 is powered by the power supply voltage VCCBG.

Figure 5B:
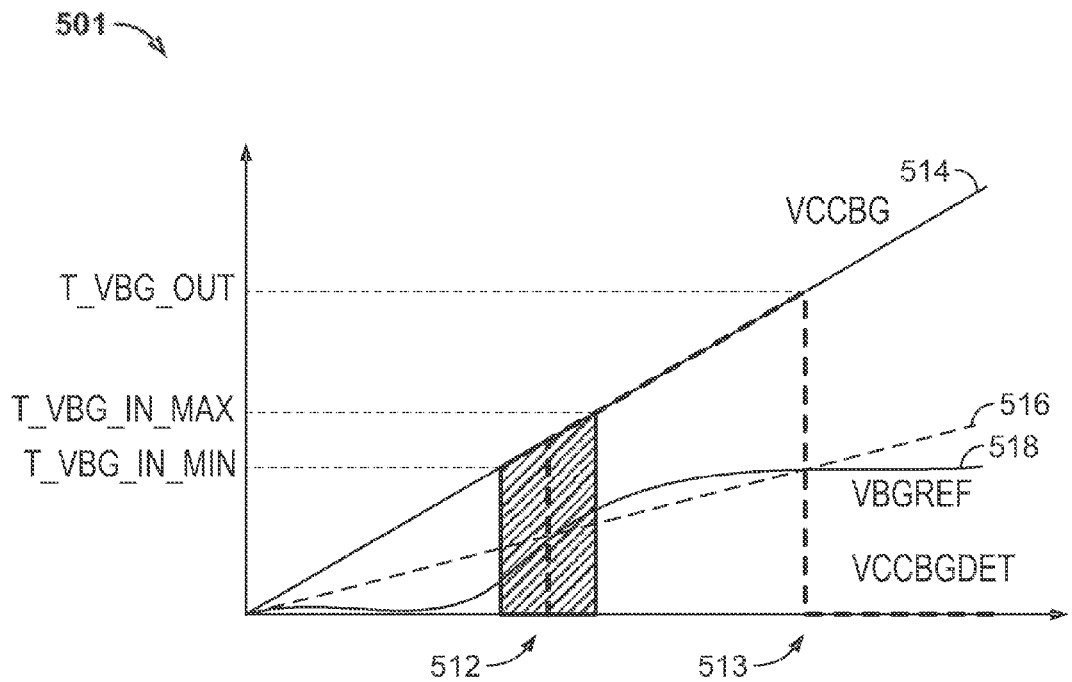
FIG. 5B shows an exemplary output of the trip detection circuitry according to an embodiment of the present invention.

FIG. 5B shows exemplary output 501 of the trip detection circuitry according to an embodiment of the present invention. In particular, FIG. 5B shows the value of the signal VCCBGDET 510 output by circuitry 500 shown in FIG. 5A as a function of the power supply voltage VCCBG and the voltage VBGREF 518 supplied to circuitry 500.

During system power-up, the power supply voltage VCCBG starts at a ground voltage level, increases, and settles into its stable-state value. For all values of the supply voltage VCCBG below a threshold voltage, the output signal VCCBGDET is unreliable because the power supply voltage powering the comparator 506 and the inverter 508 is insufficient for comparator 506 and the inverter 508 to provide reliable output signals. However, when the value of the supply voltage VCCBG is about equal to or greater than the threshold voltage (meaning that comparator 506 and the inverter 508 provide reliable output signals) and is about equal to or greater than the threshold voltage 512, the scaled value 516 of VCCBG is smaller than the voltage VBGREF 518, and the comparator outputs a logic low value. Accordingly, the inverter circuitry 508 outputs a signal VCCBGDET 510 having logic high value, which is proportional to the value of the power supply voltage VCCBG that powers the inverter circuitry 508.

In some embodiments, the value of the threshold voltage 512 may be adjusted by a user of system 500 by adjusting the values of the resistances and 504, as well the characteristics of the comparator 506 and the inverter circuitry 508. It should be noted that the value of the threshold voltage may vary between T_VBG_IN_MIN and T_VBG_IN_MAX due to temperature, the characteristics of the components included in system 500, the third threshold voltage at which the comparator 506 and the inverter 508 begin to provide reliable output signals.

When the power supply voltage VCCBG 514 is about equal to or greater than the threshold voltage 513, the scaled value 516 of VCCBG 514 is about equal to or greater than the value of the voltage VBGREF 518, and the comparator 506 outputs a logic high value. Accordingly for values of the power supply voltage greater than the threshold voltage 513, the output signal VCCBGDET 510 output by the inverter circuitry 508 is set to a logic low level.

In some embodiments, the value of the threshold voltage 513 may be adjusted by a user of system 500 by adjusting the values of the resistances 502 and 504, as well the characteristics of the comparator 506 and the inverter circuitry 508.

In some embodiments, system 500 and the larger system in which system 500 may be contained is designed such that when the power supply voltage VCCBG reaches the threshold voltage 513 during system power-up, the voltage VREF output by the bandgap voltage reference circuitry has already stabilized at a level substantially equal to the expected bandgap reference voltage level. As previously mentioned, the voltage VBGREF output by the bandgap voltage reference circuitry is designed to have low sensitivity to variations in PVT. Accordingly, when the power supply voltage VCCBG reaches the threshold voltage 513, the value to which the scaled version of VCCBG is compared by the comparator 506 is both precisely defined (i.e., substantially equal to the expected bandgap reference voltage level) and stable under variations in PVT. Advantageously, system 500 may thus be used to provide a precise, PVT-invariant threshold voltage at which its output signal VCCBGDET 510 switches from a high to a logic low level.

Figures 6A, 6B, 6C, 6D, 6E:
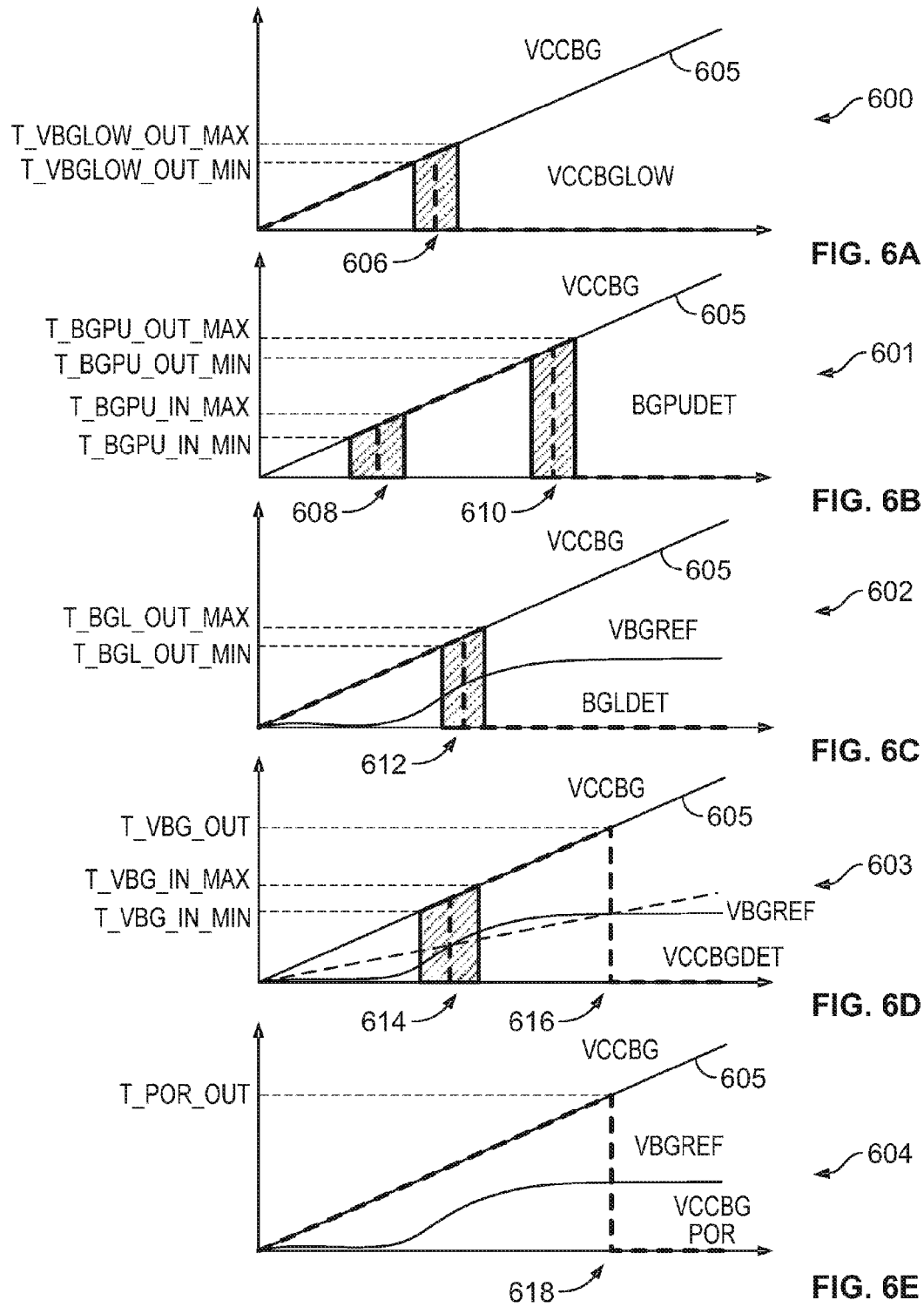
FIG. 6A shows an exemplary output of low voltage detection circuitry shown in FIG. 1 according to an embodiment of the present invention.
FIG. 6B shows an exemplary output of bandgap mimic circuitry shown in FIG. 1 according to an embodiment of the present invention.
FIG. 6C shows an exemplary output of bandgap level detection circuitry shown in FIG. 1 according to an embodiment of the present invention.
FIG. 6D shows an exemplary output of trip detection circuitry shown in FIG. 1 according to an embodiment of the present invention.
FIG. 6E shows an exemplary output of the system, shown in FIG. 1, for determining a value of a reset signal according to an embodiment of the present invention.

FIGS. 6A-6E show exemplary outputs of various elements of system 100 according to an embodiment of the present invention. In particular, FIG. 6A shows the signal VCCBGLOW output by the low voltage detection circuitry 102. FIG. 6B shows the signal BGPUDET output by the bandgap mimic circuitry 104. FIG. 6C shows the signal BGLDET output by the bandgap level detection circuitry 106. FIG. 6D shows the signal VCCBGDET output by the trip detection circuitry 108. Finally, FIG. 6E shows the reset signal 112 output by the circuitry 110. In this embodiment, the reset signal 112 is a logical OR function of the signals output by circuitries 102, 103, 106 and 108 (i.e. 102-108).

It should be noted that in some embodiments, circuitries 102, 104, 106 and 108 may be implemented as circuitries 200, 301, 400 and 500, respectively. In these embodiments, the output signals shown in FIGS. 6A, 6B, 6C, 6D and 6E correspond to the output signals shown in FIGS. 2B, 3C, 4B and 5B, respectively.

Each of the circuitries 102-108 has associated with it at least one threshold voltage, and each threshold voltage is associated with a respective voltage range. In particular, signal VCCBGLOW shown in diagram 600 of FIG. 6A has a threshold voltage 606, below which VCCBGLOW is proportional to the supply voltage VCCBG 605 and above which VCCBGLOW is at a logic low level. The value of the threshold voltage 606 may vary between T_VBGLOW_OUT_MIN and T_VBGLOW_OUT_MAX due to temperature, the characteristics of the components included in the circuitry 102, and other factors.

Signal BGPUDET shown in diagram 601 of FIG. 6B has a threshold voltage 608, which may vary between T_BGPU_IN_MIN and T_BGPU_IN_MAX, and a threshold voltage 610, which may vary between T_BGPU_OUT_MIN and T_BGPU_OUT_MAX. The threshold voltages 608 and 610 may vary within their respective ranges due to temperature, the characteristics of the components included in circuitry 104, and other factors. Signal BGPUDET shown is proportional to VCCBG 605 between the threshold voltages 608 and 610, and is at a logic low level above the threshold voltage 610.

Signal BGLDET shown in diagram 602 of FIG. 6C has a threshold voltage 612, below which BGLDET is proportional to the supply voltage VCCBG 605 and above which BGLDET is at a logic low level. The value of the threshold voltage 612 may vary between T_BGL_OUT_MIN and T_BGL_OUT_MAX due to temperature, the characteristics of the components included in circuitry 106, and other factors.

Signal VCCBGDET shown in diagram 603 of FIG. 6D has a threshold voltage 614. The value of the threshold voltage 614 which may vary between T_VBG_IN_MIN and T_VBG_IN_MAX due to temperature, the characteristics of the components included in circuitry 108, and other factors. Signal VCCBGDET also has a threshold voltage 616 Signal VCCBGDET is proportional to VCCBG 605 between the threshold voltages 614 and 616, and is at a logic low level above the threshold voltage 616.

In some embodiments, the threshold voltages associated with the circuitries 102-108 may be adjusted such that the signals output by the circuitries 102-108 overlap with each other. In these embodiments, the parameters of the various components of circuitries 102 and 104 may be adjusted such that a voltage range associated with a threshold voltage 608 is below the voltage range associated with a threshold voltage 606 (i.e., T_BGPU_IN_MAX is less than T_VGBLOW_IN_MIN). Similarly, the parameters of the various components of circuitries 104 and 106 may be adjusted such that a voltage range associated with a threshold voltage 612 is below the voltage range associated with a threshold voltage 610. The parameters of the various components of circuitries 106 and 108 may also be adjusted such that a voltage range associated with a threshold voltage 614 is below the voltage range associated with a threshold voltage 612. As mentioned previously, the output signal 112 may be a logical OR function of the signals output by circuitries 102-108 (which have output signal waveforms shown in FIGS. 6A-6D). Because the waveforms of signals output by circuitries 102-108 overlap with each other, at least one of the signals output by circuitries 102-108 is proportional to VCCBG 605 (used to encode a logic high level) for all values of VCCBG 605 below the threshold voltage 616. Accordingly, the reset signal VCCBG POR shown in diagram 604 of FIG. 6E (which corresponds to element 112 shown in FIG. 1) is proportional to VCCBG 605 for all values of VCCBG 605 below the threshold voltage 618, which corresponds to the threshold voltage 616. Furthermore, since the signals output by circuitries 102-108 are set to logical low levels when VCCBG 605 is above the threshold voltage 616, the reset signal VCCGB POR is set to a low logic level above the threshold voltage 618, which corresponds to the threshold voltage 616.

Advantageously, when the waveforms of signals output by circuitries 102-108 overlap with each other, circuitries 102-108 work in relay mode, keeping the reset signal 112 proportional to VCCBG (and thus encoding a logic high level) for all values of VCCBG below the threshold voltage 618. Thus, a larger system that receives the reset signal 112 is kept in a reset state until the bandgap voltage reference circuitry is operating properly (as determined by circuitries 102-106) and the power supply voltage VCCBG has reached an appropriately high value (as determined by circuitry 108 using the expected bandgap reference voltage level).

Figure 7:
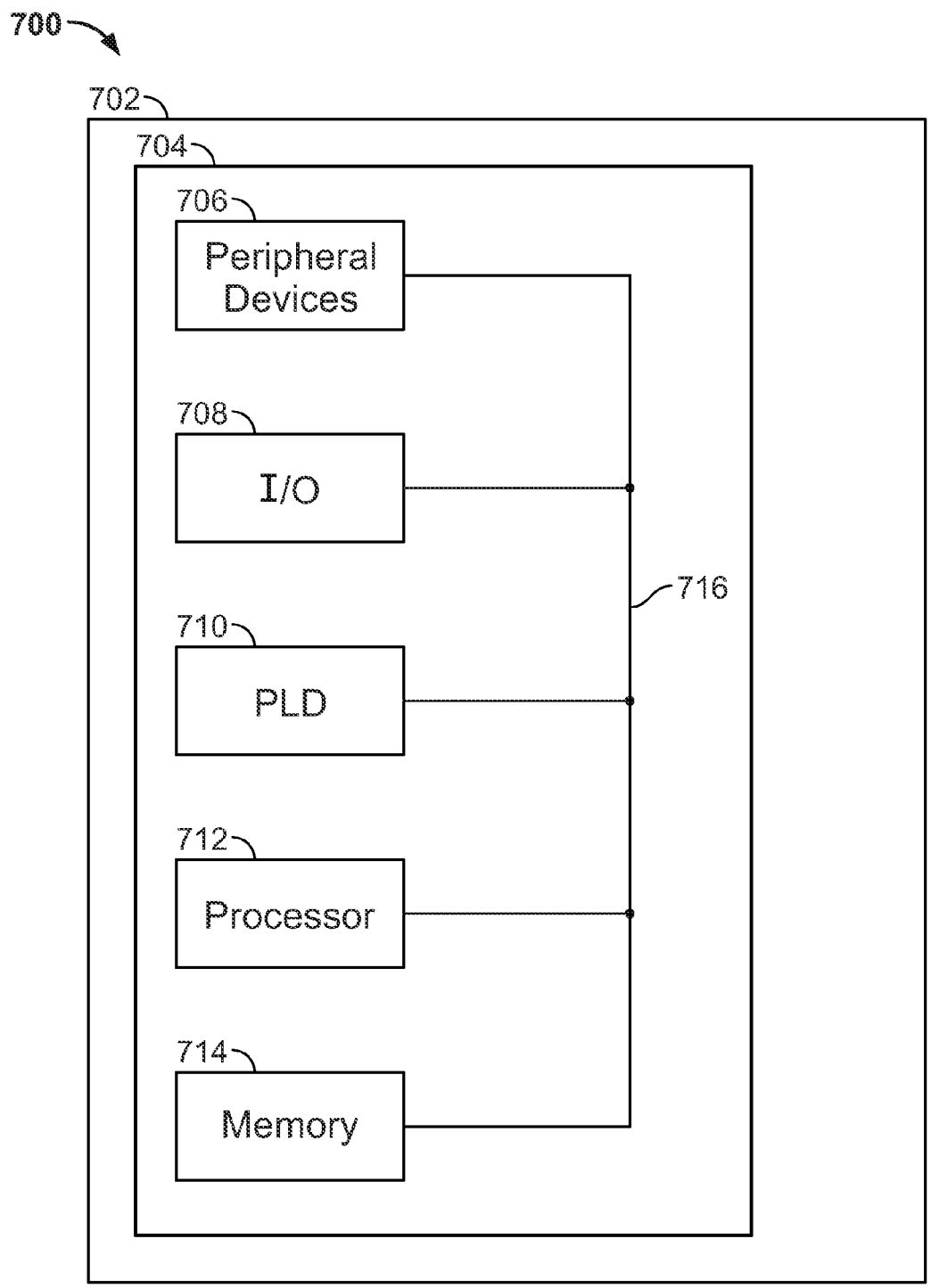
FIG. 7 shows an exemplary system that may be used to implement embodiments the present invention.

FIG. 7 illustrates an exemplary system 700 which includes embodiments of the present invention within a data processing system 700. Data processing system 700 may include one or more of the following components: processor 712, memory 714, input/output circuitry 708, programmable logic device 710, and peripheral devices 706. These components are coupled together by a system bus or other interconnections 716 and may be populated on a circuit board 704 which may be contained in an end-user system 702.

Systems 100-500 and any variations thereof within the scope of the present invention may be implemented using or as part of system 700.

System 700 may be used in a wide variety of applications, such as computer networking, data networking, instrumentation, video processing, digital signal processing, or any other application. The PLD 710 may be used to perform a variety of different logic functions. For example, the PLD 710 may be configured as a processor or controller that works in cooperation with processor 712. PLD 710 may also be used as an arbiter for arbitrating access to a shared resource in system 110. In yet another example, PLD 710 may be configured as an interface between processor 712 and one of the other components in system 700.

The foregoing is merely illustrative of the principles of this invention and various modifications can be made by those skilled in the art without departing from the scope and spirit of the invention. The above described embodiments of the present invention are presented for purposes of illustration and not of limitation, and the present invention is limited only by the claims which follow.

What is claimed is:

1. A method for determining a value of a reset signal, the method comprising:
    setting a first signal to be proportional to a power supply voltage in response to a determination from control circuitry that an output voltage of bandgap voltage reference circuitry is less than a first threshold voltage;
    setting the first signal to a logic low level in response to a determination from the control circuitry that the output voltage of the bandgap voltage reference circuit is greater than the first threshold voltage, wherein:
    the first threshold voltage is less than a bandgap reference voltage; and
    determining the value of the reset signal based at least in part on the first signal.

2. The method of claim 1, wherein the output voltage of the bandgap voltage reference circuit is substantially equal to the bandgap reference voltage when the bandgap voltage reference circuit is operating in steady state.

3. The method of claim 1, wherein:
    the first threshold voltage is a predetermined fraction of the bandgap reference voltage, and
    the fraction is less than one.

4. The method of claim 1, wherein:
    the control circuitry comprises bandgap mimic circuitry,
    the output voltage of the bandgap voltage reference circuitry depends at least in part on the power supply voltage and a bias current, and
    the output voltage of the bandgap mimic circuitry depends at least in part on the power supply voltage and the bias current.

5. The method of claim 1, wherein a determination from the control circuitry that the output voltage of the bandgap voltage reference circuit is greater than the first threshold voltage indicates that the bandgap voltage reference circuit is entering a stable operating state.

6. The method of claim 1, further comprising:
    setting a second signal to be proportional to the power supply voltage for any value of the power supply voltage that is less than a second threshold,
    setting the second signal to a logic low level in response to the power supply voltage being greater than the second threshold, wherein:
    the second threshold is at least partially determined by a threshold voltage of a PMOS transistor and a threshold voltage of an NMOS transistor; and
    determining the value of the reset signal based at least in part on the second signal.

7. The method of claim 1, further comprising:
    setting a third signal to be proportional to the power supply voltage when a scaled output of the bandgap voltage reference circuit is less than a threshold voltage of a transistor;
    setting the third signal to a logic low level when the scaled output of the bandgap voltage reference circuit is greater than a threshold voltage of the transistor; and
    determining the value of the reset signal based at least in part on the third signal.

8. The method of claim 1, further comprising:
    setting a fourth signal to be proportional to the power supply voltage when a scaled value of the power supply voltage is less than the output voltage of the bandgap voltage reference circuit;
    setting the fourth signal to a logic low level when the scaled value of the power supply voltage is greater than the output voltage of the bandgap voltage reference circuit; and
    determining the value of the reset signal based at least in part on the fourth signal.

9. The method of claim 1, wherein the reset signal is a logical OR function of the first signal and at least one other signal.

10. The method of claim 1, wherein the reset signal is asserted for every value of the power supply voltage that is lower than a scaled value of the bandgap reference voltage.

11. A system for determining a value of a reset signal, the system comprising:
    control circuitry configured to:
        set a first signal to be proportional to a power supply voltage in response to a determination that an output voltage of a bandgap voltage reference circuitry is less than a first threshold voltage;
        set the first signal to a logic low level in response to a determination that the output voltage of the bandgap voltage reference circuit is greater than the first threshold voltage, wherein:
        the first threshold voltage is less than a bandgap reference voltage; and
        determine the value of the reset signal based at least in part on the first signal.

12. The system of claim 11, wherein the output voltage of the bandgap voltage reference circuit is substantially equal to the bandgap reference voltage when the bandgap voltage reference circuit is operating in steady state.

13. The system of claim 11, wherein:
    the first threshold voltage is a predetermined fraction of the bandgap reference voltage, and
    the fraction is less than one.

14. The system of claim 11, wherein:
the control circuitry comprises bandgap mimic circuitry,
the output voltage of the bandgap voltage reference circuitry depends at least in part on the power supply voltage and a bias current, and
the output voltage of the bandgap mimic circuitry depends at least in part on the power supply voltage and the bias current.

15. The system of claim 11, wherein a determination from the control circuitry that the output voltage of the bandgap voltage reference circuit is greater than the first threshold voltage indicates that the bandgap voltage reference circuit is entering a stable operating state.

16. The system of claim 11, wherein the control circuitry is further configured to:
set a second signal to be proportional to the power supply voltage for any value of the power supply voltage that is less than a second threshold,
set the second signal to a logic low level in response to the power supply voltage being greater than the second threshold, wherein:
the second threshold is at least partially determined by a threshold voltage of a PMOS transistor and a threshold voltage of an NMOS transistor; and
determine the value of the reset signal based at least in part on the second signal.

17. The system of claim 11, wherein the control circuitry is further configured to:
set a third signal to be proportional to the power supply voltage when a scaled output of the bandgap voltage reference circuit is less than a threshold voltage of a transistor;
set the third signal to a logic low level when the scaled output of the bandgap voltage reference circuit is greater than a threshold voltage of the transistor; and
determine the value of the reset signal based at least in part on the third signal.

18. The system of claim 11, wherein the control circuitry is further configured to:
set a fourth signal to be proportional to the power supply voltage when a scaled value of the power supply voltage is less than the output voltage of the bandgap voltage reference circuit and;
set the fourth signal to a logic low level when the scaled value of the power supply voltage is greater than the output voltage of the bandgap voltage reference circuit; and
determine the value of the reset signal based at least in part on the fourth signal.

19. The system of claim 11, wherein the reset signal is a logical OR function of the first signal and at least one other signal.

20. The system of claim 11, wherein the reset signal is asserted for every value of the power supply voltage that is lower than a scaled value of the bandgap reference voltage.

21. A system for determining a value of a reset signal, the system comprising:
bandgap mimic circuitry configured to:
set a first signal to be proportional to a power supply voltage in response to a determination that an output voltage of a bandgap voltage reference circuitry is less than a first threshold voltage; and
set the first signal to a logic low level in response to a determination that the output voltage of the bandgap voltage reference circuitry is greater than the first threshold voltage, wherein:
the first threshold voltage is less than a bandgap reference voltage; and
determine the value of the reset signal based at least in part on the first signal.

22. The system of claim 21, further comprising low power supply voltage detection circuitry configured to:
set a second signal to be proportional to the power supply voltage for any value of the power supply voltage that is less than a second threshold,
set the second signal to a logic low level in response to the power supply voltage being greater than the second threshold, wherein:
the second threshold is at least partially determined by a threshold voltage of a PMOS transistor and a threshold voltage of an NMOS transistor; and
determine the value of the reset signal based at least in part on the second signal.

23. The system of claim 21, further comprising bandgap level detection circuitry configured to:
set a third signal to be proportional to the power supply voltage when a scaled output of the bandgap voltage reference circuit is less than a threshold voltage of a transistor;
set the third signal to a logic low level when the scaled output of the bandgap voltage reference circuit is greater than a threshold voltage of the transistor; and
determine the value of the reset signal based at least in part on the third signal.

24. The system of claim 21, further comprising trip detection circuitry configured to:
set a fourth signal to be proportional to the power supply voltage when a scaled value of the power supply voltage is less than the output voltage of the bandgap voltage reference circuit and;
set the fourth signal to a logic low level when the scaled value of the power supply voltage is greater than the output voltage of the bandgap voltage reference circuit; and
determine the value of the reset signal based at least in part on the fourth signal.

* * * * *